(12) United States Patent
Ali et al.

(10) Patent No.: US 11,239,230 B2
(45) Date of Patent: Feb. 1, 2022

(54) IC WITH LARGER AND SMALLER WIDTH CONTACTS

(71) Applicant: TEXAS INSTRUMENTS INCORPORATED, Dallas, TX (US)

(72) Inventors: Abbas Ali, Plano, TX (US); Guruvayurappan Mathur, Plano, TX (US); Poornika Fernandes, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/665,288

(22) Filed: Oct. 28, 2019

(65) Prior Publication Data
US 2020/0058642 A1    Feb. 20, 2020

Related U.S. Application Data

(63) Continuation of application No. 16/053,891, filed on Aug. 3, 2018, now Pat. No. 10,490,547.

(51) Int. Cl.
| H01L 27/07 | (2006.01) |
| H01L 27/06 | (2006.01) |
| H01L 49/02 | (2006.01) |
| H01L 29/06 | (2006.01) |

(52) U.S. Cl.
CPC ...... H01L 27/0629 (2013.01); H01L 27/0733 (2013.01); H01L 28/75 (2013.01); H01L 29/0653 (2013.01)

(58) Field of Classification Search
CPC . H01L 27/0629; H01L 27/0733; H01L 28/75; H01L 29/0653

USPC .......................................... 257/532; 438/381
See application file for complete search history.

(56) References Cited

U.S. PATENT DOCUMENTS

| 6,177,716 B1 * | 1/2001 | Clark .................. H01L 27/0805 257/249 |
| 6,211,058 B1 | 4/2001 | Wang et al. |
| 8,310,026 B2 * | 11/2012 | Cho ..................... H01L 23/5223 257/532 |

(Continued)

OTHER PUBLICATIONS

Wikipedia contributors. Shallow trench isolation [Internet]. Wikipedia, The Free Encyclopedia; Dec. 5, 2017, 14:24 UTC [cited Mar. 22, 2021]. Available from: https://en.wikipedia.org/w/index.php?title=Shallow_trench_isolation&oldid=813839369.

(Continued)

*Primary Examiner* — David Vu
*Assistant Examiner* — Brandon C Fox
(74) *Attorney, Agent, or Firm* — Andrew R. Ralston; Charles A. Brill; Frank D. Cimino (57) ABSTRACT

An integrated circuit (IC) includes a second metal level located between first and third metal levels, a dielectric layer located over the metal levels, and first, second and third vias within the dielectric layer. The first via traverses the first dielectric layer from a surface of the dielectric layer to the first metal level and has a first diameter. The second via traverses the dielectric layer from the surface to the second metal level and has the first diameter. The third via traverses the dielectric layer from the surface to the third metal level and has a second diameter greater than the first diameter. In some implementations the first, second and third metal levels implement a capacitor.

24 Claims, 10 Drawing Sheets

(56) References Cited

U.S. PATENT DOCUMENTS

| | | | |
|---|---|---|---|
| 2005/0212082 A1 | 9/2005 | Takeda et al. | |
| 2006/0183280 A1 | 8/2006 | Lee et al. | |
| 2007/0262417 A1* | 11/2007 | Ohtake | H01L 28/40 257/532 |
| 2009/0152678 A1* | 6/2009 | Kang | H01L 23/5223 257/532 |
| 2011/0312152 A1 | 12/2011 | Kim et al. | |
| 2014/0264751 A1* | 9/2014 | Chen | H01L 27/0629 257/533 |
| 2015/0348909 A1* | 12/2015 | Yamazaki | H01L 27/0688 257/775 |
| 2017/0236825 A1* | 8/2017 | Kim | H01L 28/00 257/532 |
| 2019/0259826 A1* | 8/2019 | Fernandes | H01L 27/0629 |

OTHER PUBLICATIONS

Wikipedia contributors. "Shallow trench isolation." Wikipedia, The Free Encyclopedia. Wikipedia, The Free Encyclopedia, Oct. 18, 2020 Web. Jun. 29, 2021.

* cited by examiner

IC WITH LARGER AND SMALLER WIDTH CONTACTS

CROSS REFERENCE TO RELATED APPLICATIONS

This application is a continuation of U.S. patent application Ser. No. 16/053,891 filed Aug. 3, 2018, issued as U.S. Pat. No. 10,490,547, the content of which is herein incorporated by reference in its entirety.

FIELD

This Disclosure relates to contacts for integrated circuit (IC) devices that include capacitors formed above a semiconductor surface layer of a substrate.

BACKGROUND

For some advanced analog or digital logic-complementary metal-oxide-semiconductor (CMOS) devices, capacitors can be built using the polysilicon gate level as the bottom plate, with the top plate material layer comprising a diffusion barrier metal such as Ti, TiN, or TaN, that is below the metal stack. Etching contacts through a dielectric layer to reach the top plate and the bottom plate of the capacitor involve different depth contacts, which is generally handled using a single contact mask level.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include ICs and methods of fabricating such ICs. An integrated circuit (IC) includes a second metal level located between first and third metal levels, a dielectric layer located over the metal levels, and first, second and third vias within the dielectric layer. The first via traverses the first dielectric layer from a surface of the dielectric layer to the first metal level and has a first diameter. The second via traverses the dielectric layer from the surface to the second metal level and has the first diameter. The third via traverses the dielectric layer from the surface to the third metal level and has a second diameter greater than the first diameter. In some implementations the first, second and third metal levels implement a capacitor.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects solve the problem of higher and variable contact resistance to the top plate of capacitors formed above the semiconductor surface layer due to problems including a residual thin dielectric layer or residual dielectric particles remaining over the top plate contact after completing the clean after the contact etch process. Such dielectric residuals after the contact etch process results in the contact fill material (e.g., W) having elevated contact resistance to the top plate of the capacitor. This problem is solved by having multiple contact widths at same contact mask level/time with a shallower and wider contact to the top plate as compared to a deeper and narrower contact to nodes in the core region of the IC. As used herein, core regions include sources, drains, and body contacts in the semiconductor surface layer as well as gates for metal oxide semiconductor (MOS) devices, and base, collector and emitter terminals in the semiconductor surface layer for bipolar devices. It is recognized that because the contact width to the top plate is increased, the aspect ratio of the top plate contact becomes lower, so that the post contact etch cleaning efficiency for the top plate contact improves.

Figure 1:
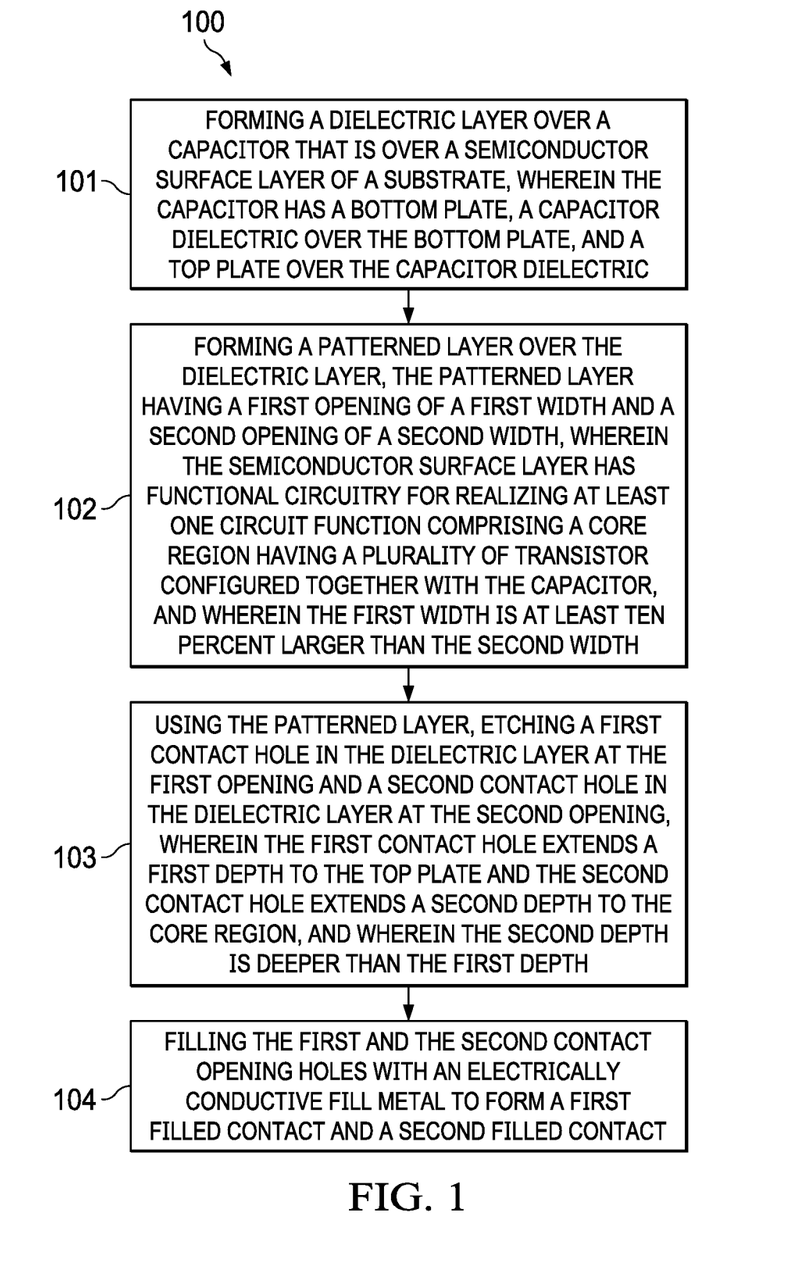
FIG. 1 is a flow chart that shows steps in an example method for forming an IC having different contact widths formed using the same mask level including a shallower contact having a wider width to the top plate of the capacitor as compared to deeper core contacts to the core region that have a narrower width, according to an example aspect.

FIG. 1 is a flow chart that shows steps in an example method 100 for forming an IC having different contact widths formed using the same mask level including shallower contacts having a wider width to the top plate of the capacitor as compared to deeper contacts that have a narrower width to nodes in the core region of the IC. The fill material in the contacts generally comprises W, diffusion barrier materials such as TaN, or TiW, or copper. The larger size contact widths to the top plate of the capacitor as evidenced in the Examples below provides better ohmic contact (lower contact resistance) with an improvement being beyond the contact resistance reduction from the larger area contact alone, and a better contact resistance distribution (i.e., less outliers) as well. These benefits are provided without any penalty to other figure of merits (FOMs) for the IC, such as complementary MOS (CMOS) digital density for CMOS ICs, polysilicon to contact spacing rules, and general technology design rules for the core technology.

Step 101 comprises forming a dielectric layer over a capacitor that is over a semiconductor surface layer of a substrate, wherein the capacitor has a bottom plate, a capacitor dielectric over the bottom plate, and a top plate over the capacitor dielectric. Step 102 comprises forming a patterned layer over the dielectric layer, the patterned layer having a first opening of a first width and a second opening of a second width, wherein the semiconductor surface layer has functional circuitry for realizing at least one circuit function comprising a core region having a plurality of transistor configured together with at least the capacitor, and wherein the first width is at least ten (10) % greater than the second width. A contact mask used has the first widths and second widths, and the patterned layer is generally a photoresist layer.

Step 103 comprises using the patterned layer, etching a first contact hole in the dielectric layer at the first opening and a second contact hole in the dielectric layer at the second opening, wherein the first contact hole extends a first depth to the top plate and the second contact hole extends a second depth to the core region, and wherein the second depth is deeper than the first depth. Step 104 comprises filling the first and the second contact holes with an electrically conductive fill metal to form a first filled contact and a second filled contact.

Figure 2A:
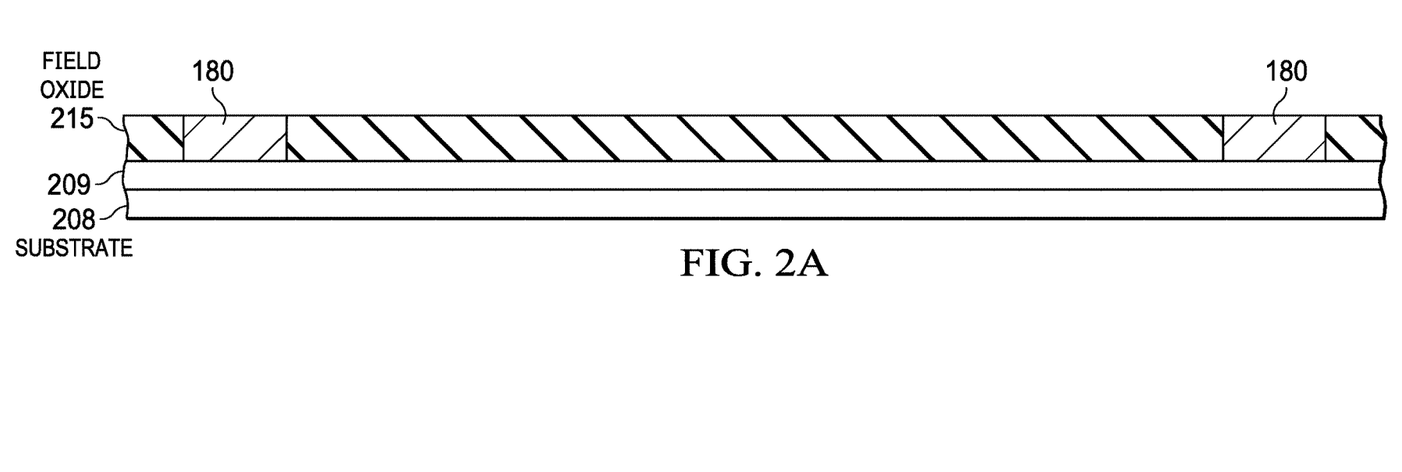
FIGS. 2A-I show successive cross sectional depictions for forming a capacitor on an IC having a polysilicon bottom plate that is on a capacitor dielectric layer over a semiconductor surface layer, where there are different contact widths on the IC including a larger width filled contact to the top plate of the capacitor as compared to the core contacts having a smaller width contact.
Figure 2B:
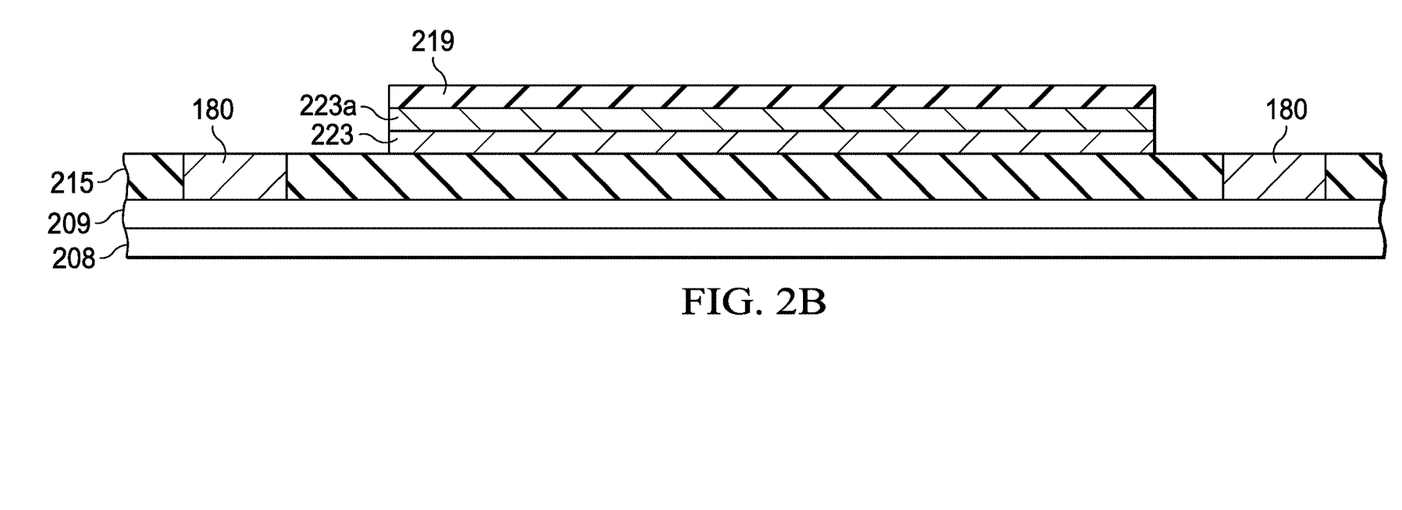
Figure 2C:
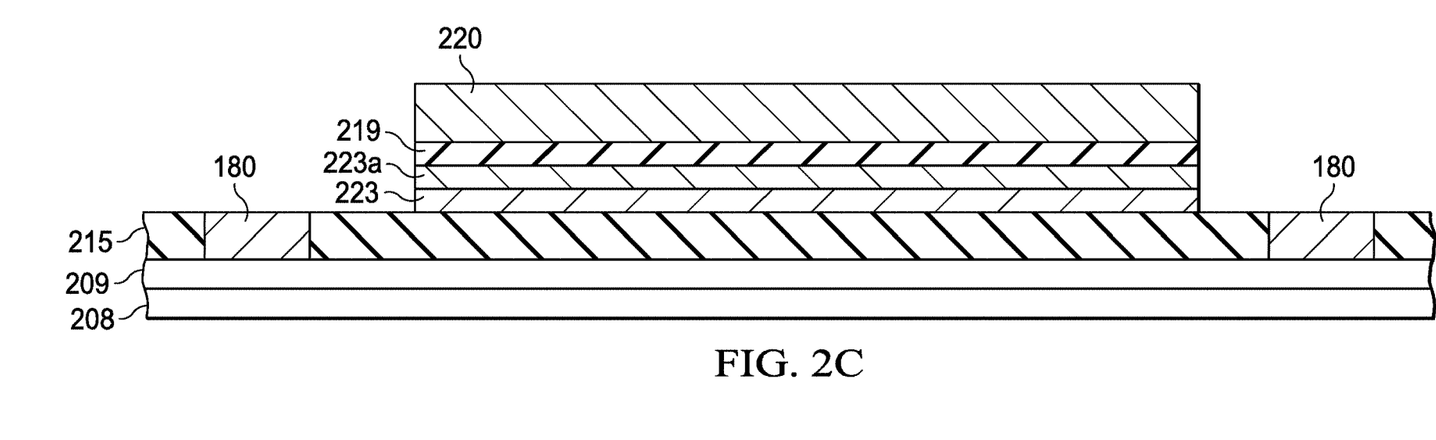
Figure 2D:
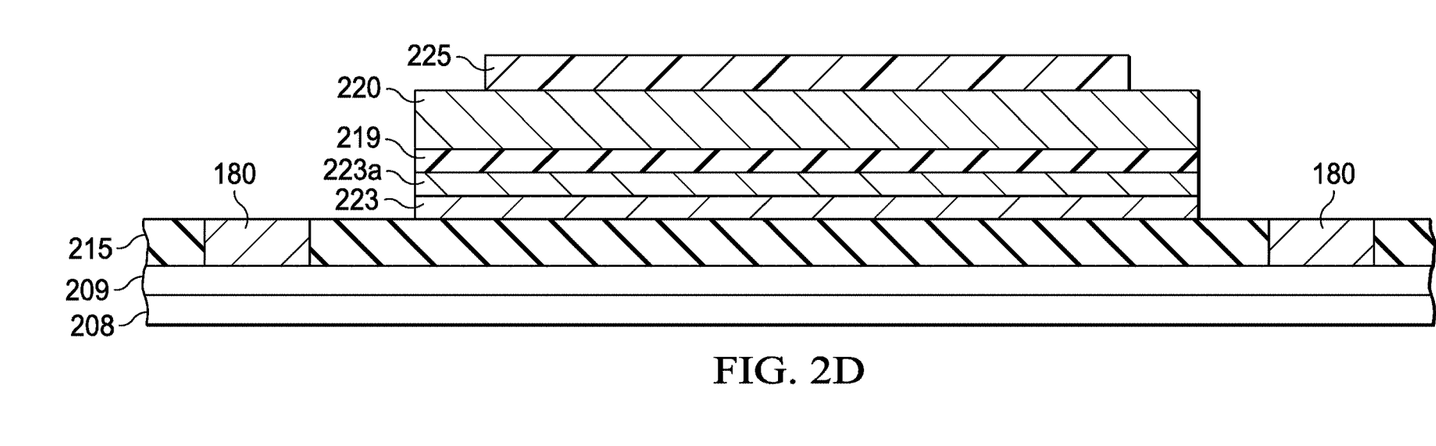
Figure 2E:
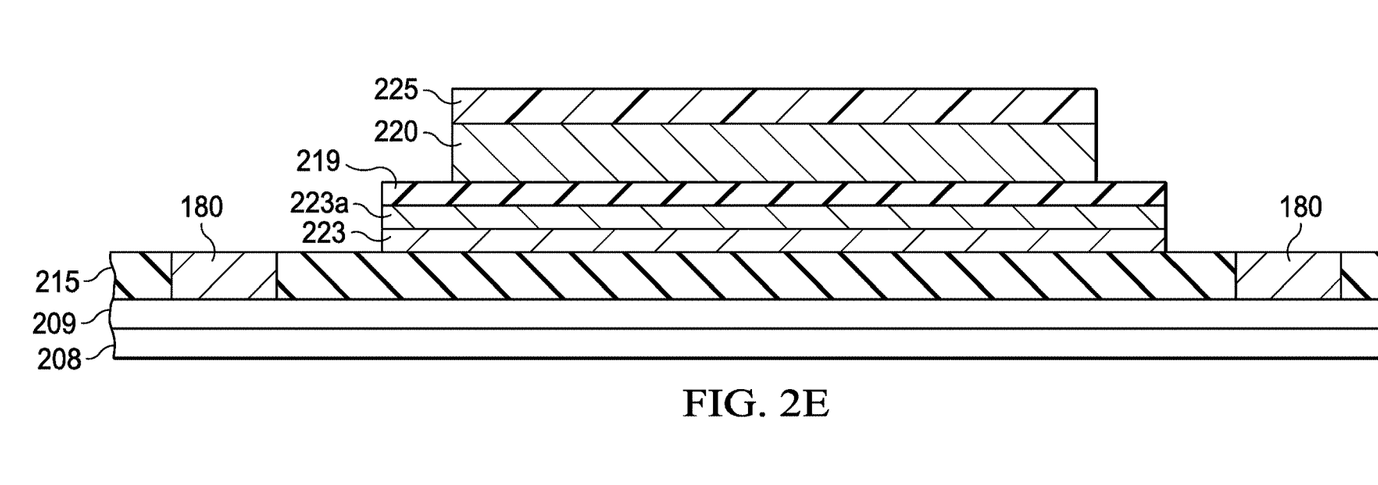
Figure 2F:
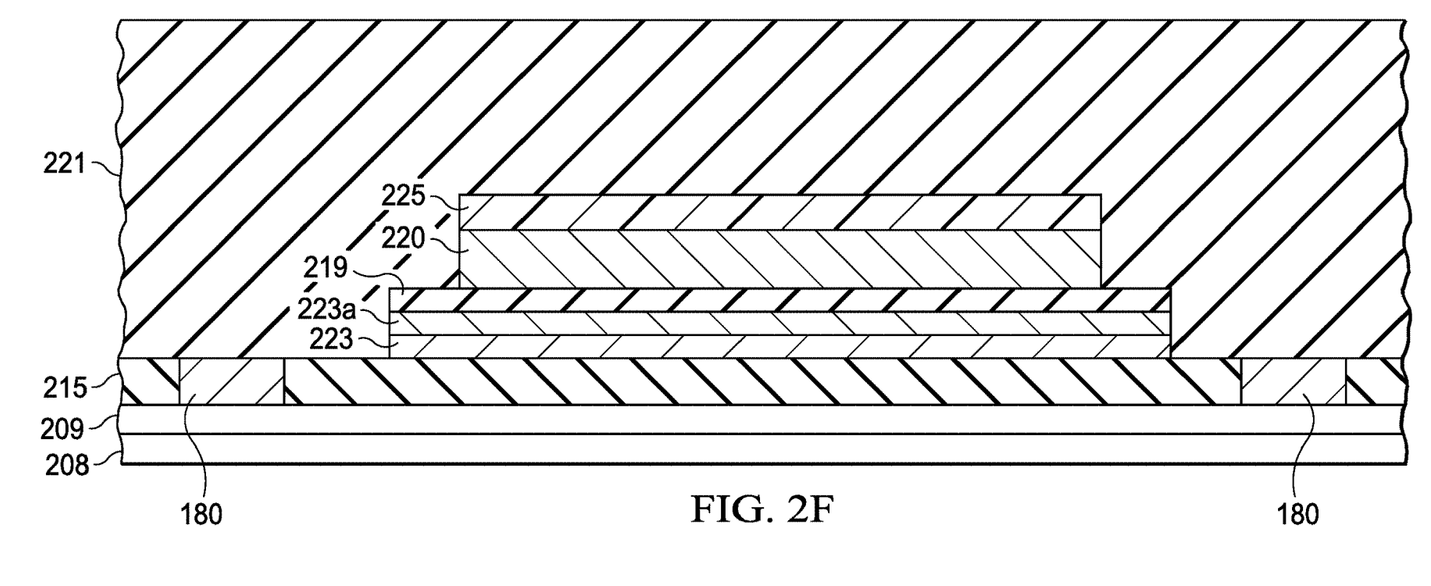
Figure 2G:
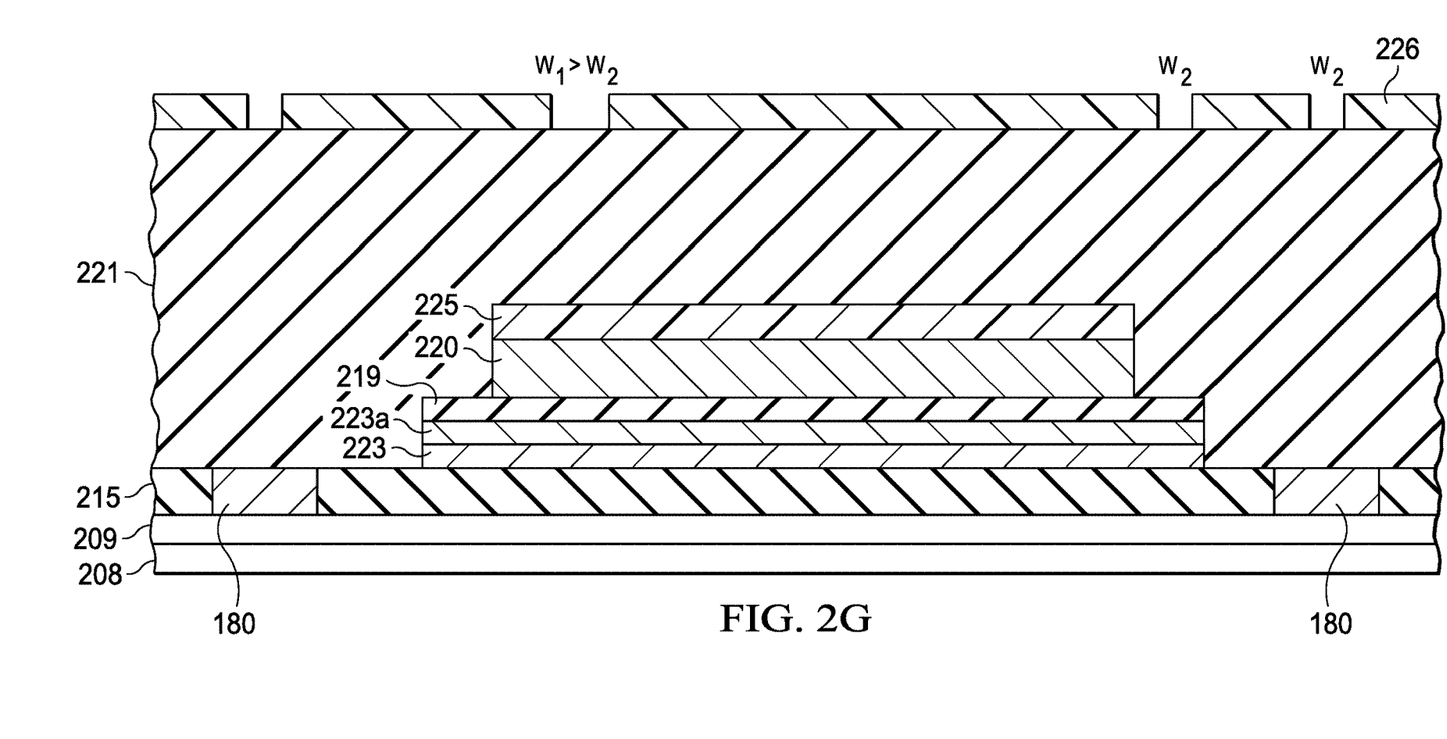
Figure 2H:
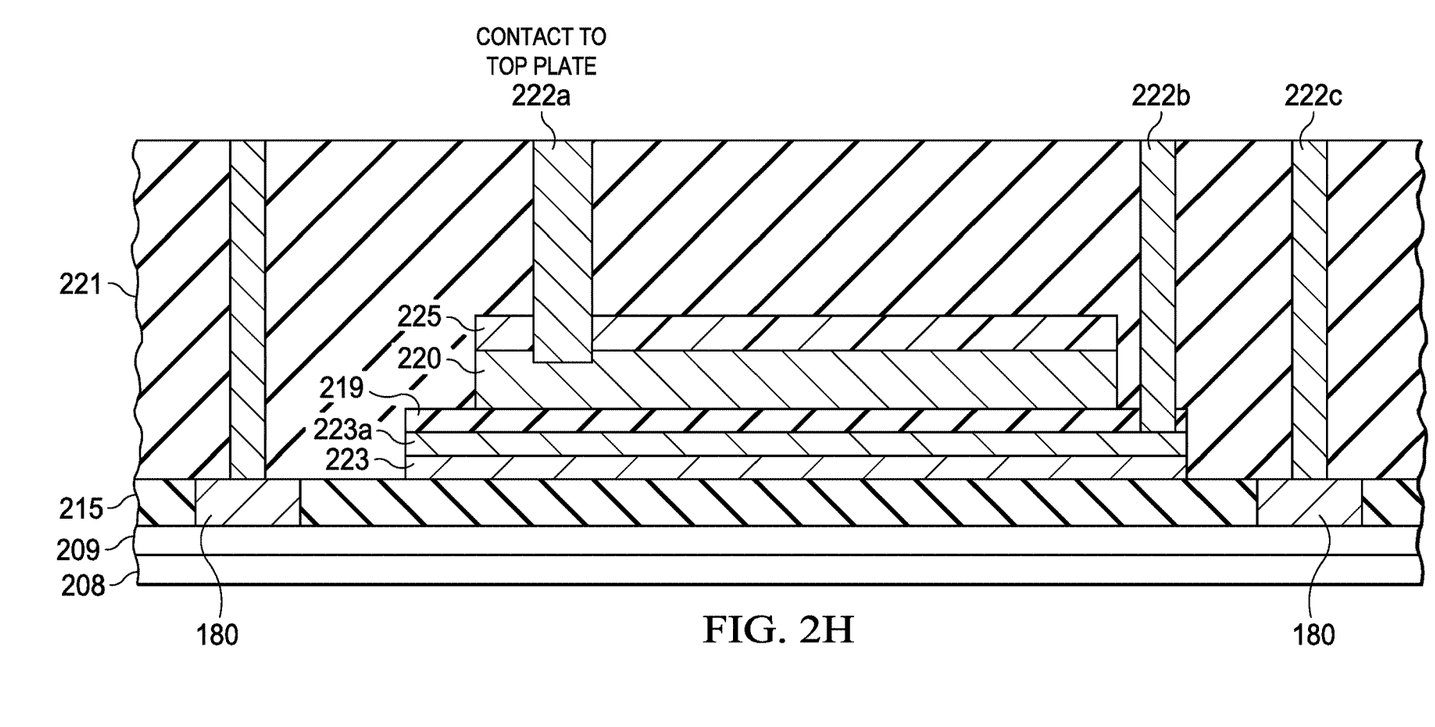
Figure 2I:
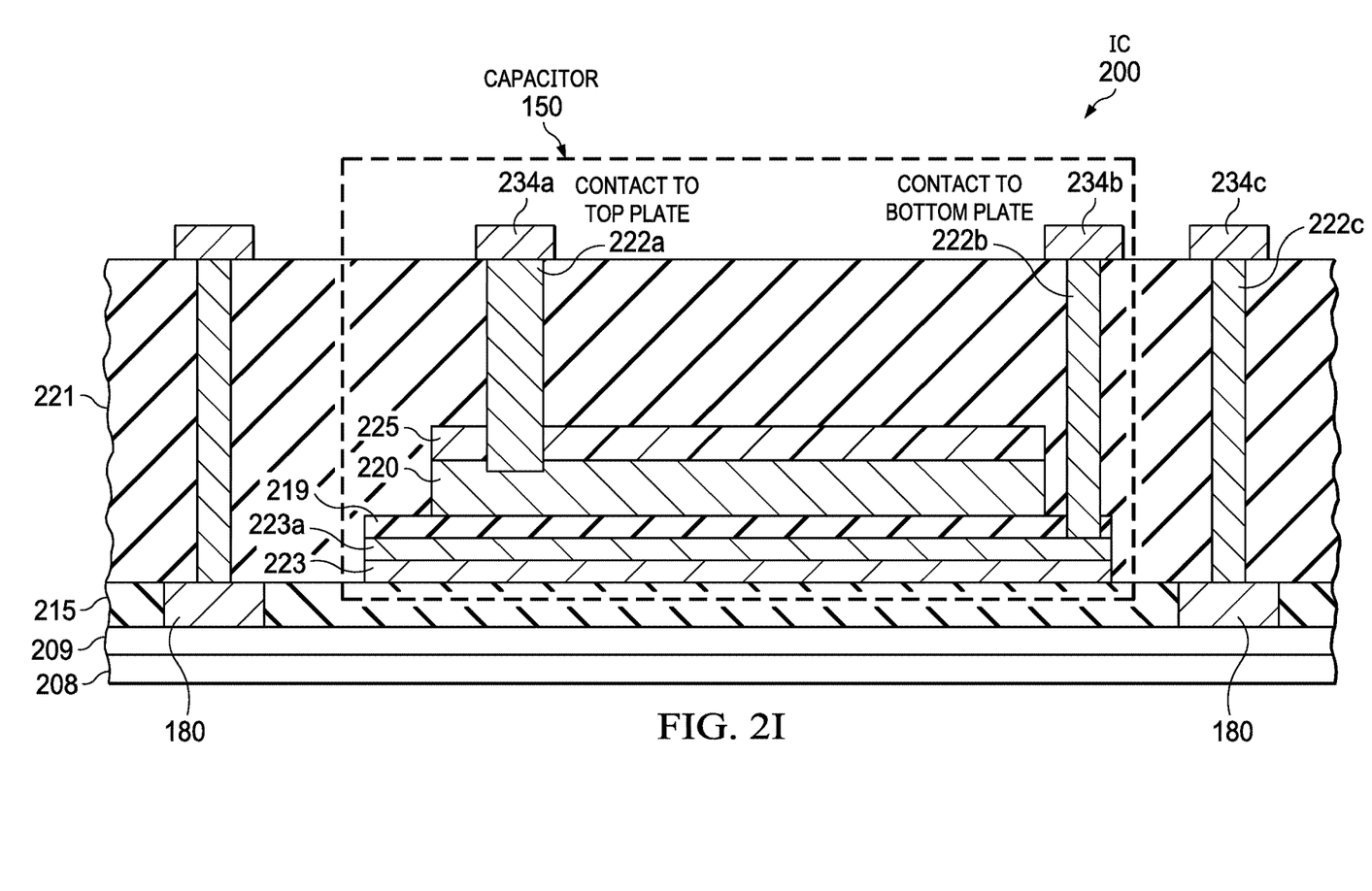

As shown in FIG. 2I described in detail below, the capacitor 150 is above a field oxide layer 215 that is on the semiconductor surface layer 209. The capacitor 150 comprises a top plate 220 on a capacitor dielectric layer 219 on a bottom plate 223, where the first width features shown as first filled contacts 222a are at least ten (10) % greater than the second width features shown as second filled contacts 222c to the core region, and second width features also optionally shown to third filled contact 222b which contact the bottom plate of the capacitor.

FIG. 2A shows a semiconductor surface layer 209 on a substrate 208 including functional circuitry 180 in the core region of the device shown simply as a block, with field oxide 215 being shallow trench isolation (STI) shown in the semiconductor surface layer 209 with its characteristic planarity on a portion of the semiconductor surface layer 209. The functional circuitry 180 comprises circuit elements (including transistors, and generally diodes, resistors, capacitors, etc.) formed in the semiconductor surface layer 209 configured together with the capacitor(s) for realizing at least one circuit function such as analog (e.g., an amplifier, power converter or power field effect transistor (FET)), RF, digital, or a memory function.

FIG. 2B shows the in-process IC shown in FIG. 2A after depositing a polysilicon layer 223, patterning and etching the polysilicon layer 223, forming a silicide layer 223a on the top surface of the polysilicon layer 223 which provides a bottom plate for the capacitor, and depositing a capacitor dielectric 219 on the silicide layer 223a. The total thickness of the capacitor dielectric 219 is generally 20 nm to 200 nm, which can be a single layer or can comprise 2 or more layers. The capacitor dielectric stack can include at least one silicon nitride (SiN) layer. In one particular arrangement the capacitor dielectric 219 comprises a silicon oxide-SiN-silicon oxide stack that may be referred to as an ONO stack.

FIG. 2C shows the in-process IC after depositing a top capacitor plate layer 220 on the capacitor dielectric layer 219. FIG. 2D shows the in-process IC after depositing, patterning and etching a hard mask layer 225 on the top plate 220. The hard mask layer 225 can be deposited using a plasma enhanced chemical vapor deposition (PECVD) process for depositing silicon nitride or silicon oxynitride at a pressure of about 2.5 to 5 torr, at a temperature of about 350° C. The hard mask layer 225 thickness range can be 5 nm to 150 nm.

FIG. 2E shows the in-process IC after etching the top capacitor plate 220 and the capacitor dielectric 219. FIG. 2F shows the in-process IC after depositing and planarizing (e, g., using chemical mechanical polishing (CMP)) a pre-metal dielectric (PMD) layer 221. The PMD layer 221 can comprise a tetraethoxysilane (TEOS)-derived silicon oxide layer. A TEOS deposition for a non-plasma deposition process can comprise low pressure CVD (LPCVD) at a pressure of about 200 to 400 mTorr and at a temperature of about 700° C. However, other dielectric layers can also be used for the PMD layer 221 including deposited silicon oxides, such as comprising an organosilicate glass (OSG), a low-k dielectric (i.e., a smaller dielectric constant relative to silicon dioxide), a doped dielectric layer such as a phosphorus doped silicate glass (PSG), a fluorine-doped silica glass (FSG), high density plasma oxide (HDP), or a SiN layer or its variants (e.g., SiON). The thickness range for the PMD layer 221 is generally 600 nm to 800 nm.

FIG. 2G shows the in-process IC after forming a patterned layer 226 (such as a photoresist (PR) pattern) over the PMD layer 221 using a contact mask having a first width to form larger first width openings shown as $W_1$ and a second width to form smaller second width openings shown as $W_2$, including $W_2$ openings over the functional circuitry 180 in the core region, and over the silicide layer 223a extending beyond the top capacitor plate 220 to provide contact to the bottom plate of the capacitor provided by the polysilicon layer 223. This in-process IC corresponds to the structure after step 102 in method 100. As described above, the $W_1$ openings have a width that is at least 10% greater than the $W_2$ openings, such as at least 20% greater, or at least 30% greater.

FIG. 2H shows the in-process IC after etching contact holes in the PMD layer 221 using the pattern from the patterned layer 226 corresponding to step 103, and filling the contact holes with an electrically conductive filler material metal such as W, TiN, TaN or Cu corresponding to step 103. Following step 104 as shown in FIG. 2H there are provided a first filled contact 222a to the top plate 220, a third filled contact 222b to the contact to the silicide layer 223a extending beyond the top capacitor plate 220 to contact the bottom plate of the capacitor, and a second filled contact 222c in the core region to the contact the nodes of the functional circuitry 180, typically to contact MOSFET sources, drains, and body regions.

FIG. 2I shows the in-process IC shown as IC 200 after depositing, patterning, and then etching an interconnect metal layer to form metal interconnects 234a, 234b, and 234c on the PMD layer 221 over the filled contacts 222a, 222b, and 222c, respectively. IC 200 features different contact widths including a larger contact width shown as first filled contacts 222a to the top plate 220 of the capacitor 150 as compared to the second filled core contacts shown as 222c and optionally the third filled contacts 222b to the bottom plate both having the smaller contact width. The metal interconnects can comprise AlCu, typically with 0.5 to 4 wt. % Cu. Alternatively, the metal interconnect layer can comprise only copper in which case a damascene process is generally performed (a damascene process is not shown in FIGS. 2A-2I).

The wafer processing can then then be completed by conventional back end of the line (BEOL) processing comprising forming one or more additional metal levels thereon including a top metal level. The top metal layer can comprise aluminum (or an aluminum alloy) or copper. Passivation overcoat (PO) then generally follows, followed by patterning the PO to expose the bond pads. The PO layer comprises at least one dielectric layer such as silicon oxide, SiN, or SiON.

Examples

Disclosed aspects are further illustrated by the following specific Examples, which should not be construed as limiting the scope or content of this Disclosure in any way.

Figure 3A:
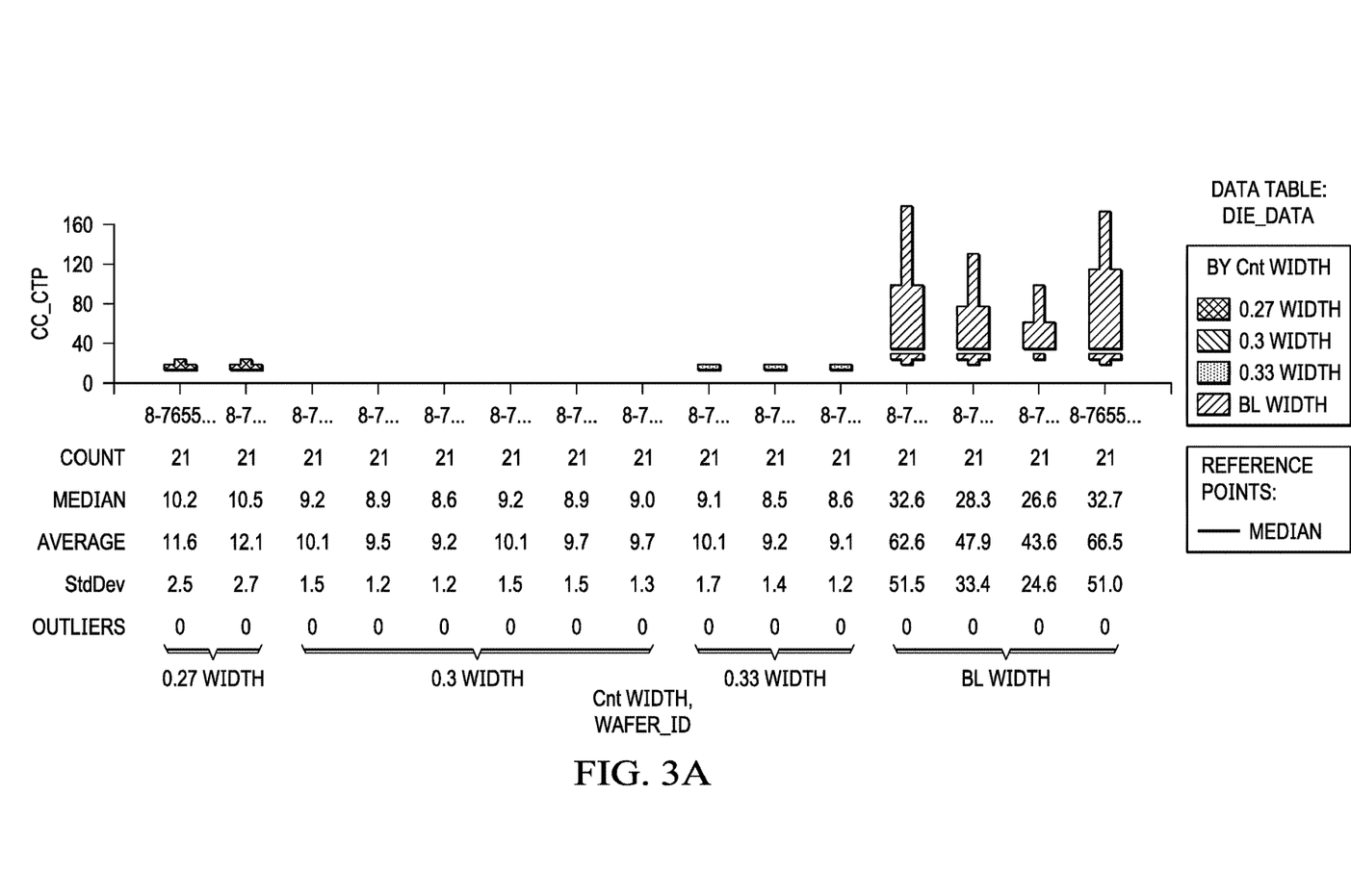
FIGS. 3A and 3B show measured contact resistance data from Kelvin isolated resistors for a contact chain and single contacts, respectively.
Figure 3B:
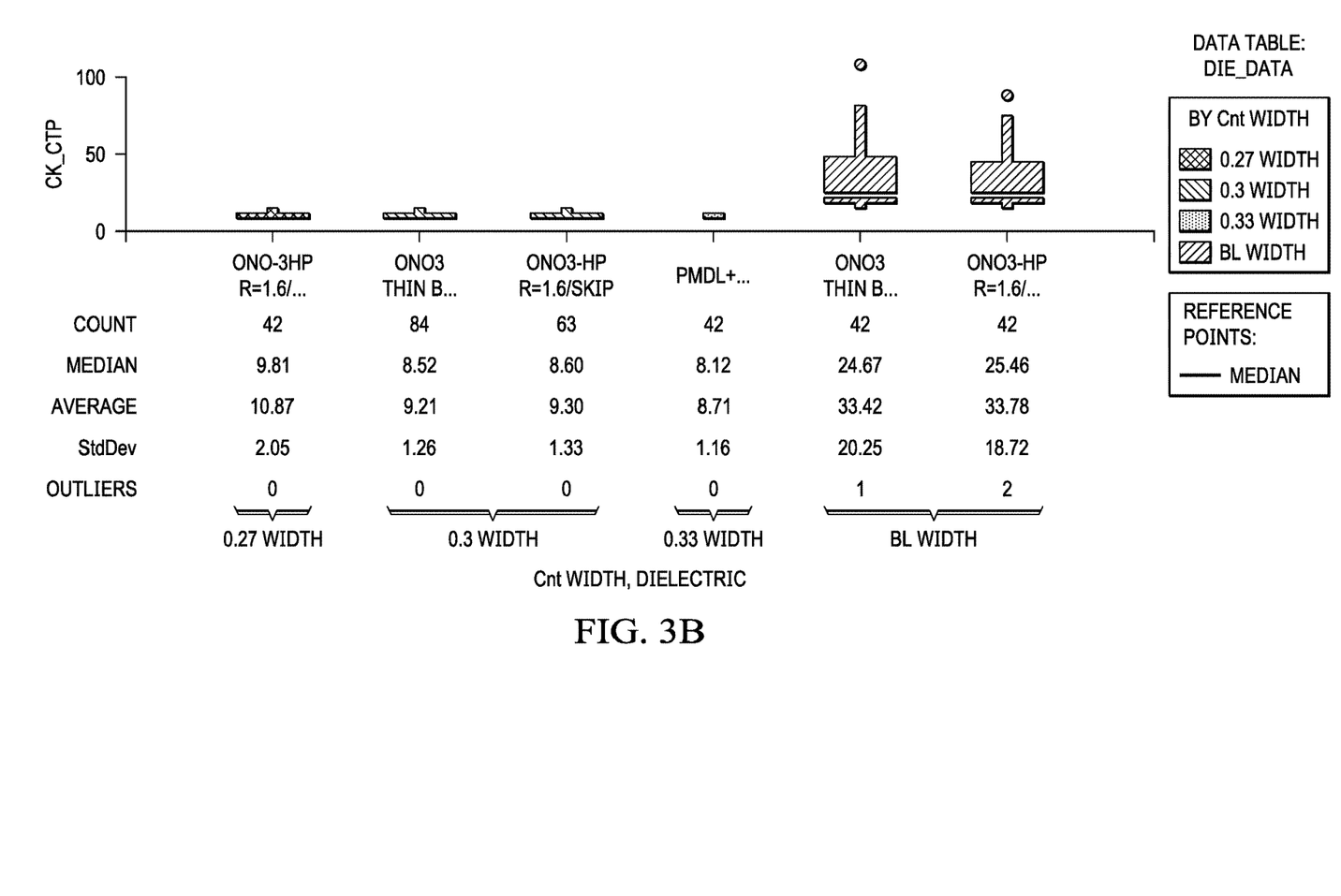

FIGS. 3A and 3B show measured contact resistance data at room temperature from Kelvin isolated resistors for a contact chain and single contacts, respectively. The data shown evidences a significantly lower average contact resistance is obtained that is less than the reduced contact resistance value calculated taking into consideration the increased contact area, and a significant reduction in the standard deviation of the contact resistance, as well as the elimination of contact resistance outliers for a larger contact width to the top plate of a capacitor having a polysilicon bottom plate, as compared to a baseline (shown as BL) smaller contact width for the top plate of the otherwise same capacitor structure.

Disclosed aspects can be used to form IC die that may be integrated into a variety of assembly flows to form a variety of different devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
    forming a first via through a first dielectric layer to a first conductive level over a semiconductor substrate, the first via having a first diameter;
    forming a second via through the first dielectric layer to a second conductive level located over the first conductive level and directly over a shallow trench isolation (STI) layer that touches the first dielectric layer, the second via having the first diameter;
    forming a third via through the first dielectric layer to a third conductive level located directly over the second conductive level, the third via having a second diameter different than the first diameter.

2. The method of claim 1, wherein the second conductive level and the third conductive level include top and bottom plates of a capacitor.

3. The method of claim 2, wherein the first conductive level includes circuitry configured to implement a circuit function in cooperation with the capacitor.

4. The method of claim 2, wherein a capacitor dielectric is located between the second and third conductive levels, and wherein forming the second via includes removing a portion of the capacitor dielectric.

5. The method of claim 4, wherein the capacitor dielectric comprises a multilayer stack including at least one layer of silicon oxide and at least one layer of silicon nitride.

6. The method of claim 1, wherein forming the third via includes removing a portion of a second dielectric layer between the third conductive level and the first dielectric layer.

7. The method of claim 6, wherein the first dielectric layer comprises silicon oxide and the second dielectric layer comprises silicon nitride or silicon oxynitride.

8. The method of claim 1, wherein the third conductive level comprises TiN, Ti or TaN.

9. The method of claim 1, wherein the second diameter is at least 20% greater than the first diameter.

10. The method of claim 1, wherein the second diameter is larger than the first diameter.

11. The method of claim 1, wherein the first conductive level is at a semiconductor surface over the semiconductor substrate, the second conductive level includes a polysilicon layer, and the third conductive level includes Ti, TiN or TaN.

12. An integrated circuit (IC), comprising:
    first, second and third conductive levels located over a semiconductor substrate, the second conductive level located between the first and third conductive levels, and the first conductive level located between the second conductive level and the substrate and including a circuit element formed in a semiconductor layer over the substrate;
    a first dielectric layer located over the first, second and third conductive levels, and having a surface, the first dielectric layer touching a shallow trench isolation (STI) layer that is located within the semiconductor layer adjacent the circuit element;
    a first via that traverses the first dielectric layer from the surface to the first conductive level, the first via having a first diameter;
    a second via that traverses the first dielectric layer from the surface to the second conductive level, the second via having the first diameter; and
    a third via that traverses the first dielectric layer from the surface to the third conductive level, the third via having a second diameter different than the first diameter.

13. The IC of claim 12, wherein the second conductive level and the third conductive level are electrodes of a capacitor.

14. The IC of claim 13, wherein the first conductive level includes circuitry configured to implement a circuit function in cooperation with the capacitor.

15. The IC of claim 13, wherein a capacitor dielectric is located between the second and third conductive levels, and the second via traverses a portion of the capacitor dielectric located between the second conductive level and the first dielectric layer.

16. The IC of claim 15, wherein the first dielectric layer comprises silicon oxide and the second dielectric layer comprises silicon nitride or silicon oxynitride.

17. The IC of claim 15, wherein the capacitor dielectric comprises a multilayer stack comprising at least one layer of silicon oxide and at least one layer of silicon nitride or silicon oxynitride.

18. The IC of claim 15, wherein the capacitor dielectric has a thickness in a range between about 20 nm and about 200 nm.

19. The IC of claim 12, wherein the first dielectric layer comprises a first dielectric material, and the third via traverses a second dielectric layer between the third conductive level and the first dielectric layer, the second dielectric layer comprising a second different dielectric material.

20. The IC of claim 12, wherein the third conductive layer comprises TiN, Ti or TaN.

21. The IC of claim 12, wherein the third width is at least 10% greater than the first width.

22. The IC of claim 12, wherein the third width is at least 20% greater than the first width.

23. An integrated circuit (IC), comprising:
a circuit level in or over a semiconductor substrate, the circuit level including at least one transistor;
a capacitor formed over the semiconductor substrate and configured to implement a circuit function in cooperation with the at least one transistor, the capacitor including:
  a bottom plate comprising polysilicon located over a shallow trench isolation (STI) layer;
  a top plate comprising Ti, TiN or TaN;
  a capacitor dielectric between the top and bottom plates;
a pre-metal dielectric (PMD) layer including silicon oxide located over the circuit level and the capacitor, and extending from the bottom plate toward the STI layer
a first via through the PMD layer that electrically connects to the circuit level;
a second via through the PMD layer that electrically connects to the bottom plate; and
a third via through the PMD layer that electrically connects to the top plate,
wherein the first and second vias each have a first diameter, and the third via has a second diameter larger than the first diameter.

24. An integrated circuit (IC), comprising:
a first conductive level touching a semiconductor at a bottom of the first conductive level;
a shallow trench isolation (STI) layer located in a trench within the semiconductor adjacent the first conductive level;
a second conductive level over the STI layer;
a third conductive level located between the second conductive level and the STI layer;
a first via having a first diameter that traverses a dielectric layer and connects to the first conductive layer, the dielectric layer touching each of the second and third conductive layers and extending from the third conductive layer toward the STI layer;
a second via having the first diameter that traverses the dielectric layer and connects to the third conductive layer;
a third via having a second different diameter that traverses the dielectric layer and connects to the second conductive layer.

* * * * *